(12) United States Patent
Petersen et al.

(10) Patent No.: US 7,323,890 B2
(45) Date of Patent: Jan. 29, 2008

(54) MULTI-POINT PROBE

(75) Inventors: Christian Leth Petersen, Virum (DK); Francois Grey, Copenhagen (DK); Peter Boggild, Copenhagen (DK)

(73) Assignee: Capres APS (DK)

( * ) Notice: Subject to any disclaimer, the term of this patent is extended or adjusted under 35 U.S.C. 154(b) by 0 days.

(21) Appl. No.: 10/675,886

(22) Filed: Sep. 30, 2003

(65) Prior Publication Data

US 2004/0056674 A1 Mar. 25, 2004

Related U.S. Application Data

(63) Continuation of application No. 09/750,645, filed on Dec. 28, 2000, now abandoned, which is a continuation of application No. PCT/DK99/00391, filed on Jul. 8, 1999.

(30) Foreign Application Priority Data

Jul. 8, 1998 (EP) .................................. 98610023
Mar. 17, 1999 (DK) ............................. 1999 00378

(51) Int. Cl.
G01R 31/02 (2006.01)

(52) U.S. Cl. ...................... 324/754; 324/761; 324/762; 324/765

(58) Field of Classification Search ........ 324/754–755, 324/757–758, 761–762, 765
See application file for complete search history.

(56) References Cited

U.S. PATENT DOCUMENTS 3,984,620 A * 10/1976 Robillard et al. ........... 174/541
4,329,642 A * 5/1982 Luthi et al. .................. 324/755

(Continued)

FOREIGN PATENT DOCUMENTS

| DE | 43 01 420 | 6/1993 |
|---|---|---|
| DE | 196 48 475 | 6/1997 |
| EP | 0 299 875 | 1/1989 |

(Continued)

OTHER PUBLICATIONS

Fujii, et al., "Micropattern measurement with an atomic force microscope", *Journal of Vacuum Science & Technology: Part B*, vol. 9, No. 2, pp. 666-669 (Mar./Apr. 1991).

(Continued)

*Primary Examiner*—Ha Tran Nguyen
*Assistant Examiner*—Arleen M. Vazquez
(74) *Attorney, Agent, or Firm*—Altera Law Group, LLC

(57) ABSTRACT

A multi-point electrical probe for testing location-specific electrical properties on circuit boards. Four generally parallel, electrically conducting probe arms are produced preferably by wafer-based techniques, although any even number of probe arms between two and 64 may be used. The precision of wafer-based manufacturing techniques permits miniaturization beyond that which is conventionally obtained by assembling discrete components. The probe arms are generally flexible, and may be shaped suitably to accommodate a particular circuit geometry. The probe and/or the sample under test may be precisely located by suitable translation and/or rotation stages, which may optionally be placed under computer control. A suitable wiring diagram is provided, and preferable manufacturing techniques are discussed. In addition, the conducting probe arms benefit from active guarding, which reduces leakage resistance and increases the measuring accuracy of the probe, by the inclusion of electrically-isolated conducting regions located between the probe arms.

50 Claims, 9 Drawing Sheets

U.S. PATENT DOCUMENTS

| | | | | |
|---|---|---|---|---|
| 4,520,314 | A * | 5/1985 | Asch et al. | 324/762 |
| 5,171,992 | A | 12/1992 | Clabes et al. | |
| 5,347,226 | A | 9/1994 | Bachmann et al. | |
| 5,383,354 | A * | 1/1995 | Doris et al. | 73/105 |
| 5,475,318 | A | 12/1995 | Marcus et al. | |
| 5,540,958 | A | 7/1996 | Bothra et al. | |
| 5,557,214 | A | 9/1996 | Barnett | |
| 5,565,788 | A * | 10/1996 | Burr et al. | 324/762 |
| 5,613,861 | A | 3/1997 | Smith et al. | |
| 5,734,176 | A * | 3/1998 | Oldfield | 257/48 |
| 5,900,738 | A * | 5/1999 | Khandros et al. | 324/761 |
| 6,482,013 | B2 * | 11/2002 | Eldridge et al. | 439/66 |
| 6,496,026 | B1 * | 12/2002 | Long et al. | 324/762 |
| 7,042,236 | B1 * | 5/2006 | Wollitzer | 324/754 |

FOREIGN PATENT DOCUMENTS

| | | |
|---|---|---|
| EP | 0 466 274 | 1/1992 |
| EP | 0 899 538 | 3/1999 |
| JP | 01147374 | 6/1989 |
| JP | 07199219 | 8/1995 |
| JP | 8-15318 | 1/1996 |
| WO | WO 94/11745 | 5/1994 |

OTHER PUBLICATIONS

Hong, et al., "Design and Fabrication of a Monolithic High-Density Probe Card for High-Frequency On-Water Testing", *Institute of Electrical and Electronics Engineers*, pp. 289-292 (Dec. 3, 1989).

Koops, et al., "Constructive three-dimensional lithography with electron-beam induced deposition for quantum effect devices", *Journal of Vacuum Science & Technology B (Microelectronics Processing and Phenomena)*, vol. 11, No. 6, pp. 2286-2289 (Nov./Dec. 1993).

Koops, et al., "Conductive dots, wires, and supertips for field electron emitters produced by electron-beam induced deposition on samples having increased temperature", *Journal of Vacuum Science & Technology B (Microelectronics Processing and Phenomena)*, vol. 14, No. 6, pp. 4105-4109 (Nov./Dec. 1996).

Lee, et al., "High-Density Silicon Microprobe Arrays for LCD Pixel Inspection", *Institute of Electrical and Electronics Engineers*, pp. 429-434 (Feb. 11, 1996).

Niu, et al., "Double-tip scanning tunneling microscope for surface analysis", *Physical Review B*, vol. 51, No. 8, pp. 5502-5505 (Feb. 15, 1995).

Shi, et al., "New method of calculating the correction factors for the measurement of sheet resistivity of a square sample with a square four-point probe", *Rev. Sci. Instrum.*, vol. 68, No. 4, pp. 1814-1817 (Apr. 1997).

Smits, "Measurement of Sheet Resistivities with the Four-Point Probe", *The Bell System Technical Journal*, vol. 37, pp. 711-718 (May 1958).

International Search Report (Completion date Jan. 12, 2000) for PCT/DK99/00391 (Jul. 8, 1999).

* cited by examiner

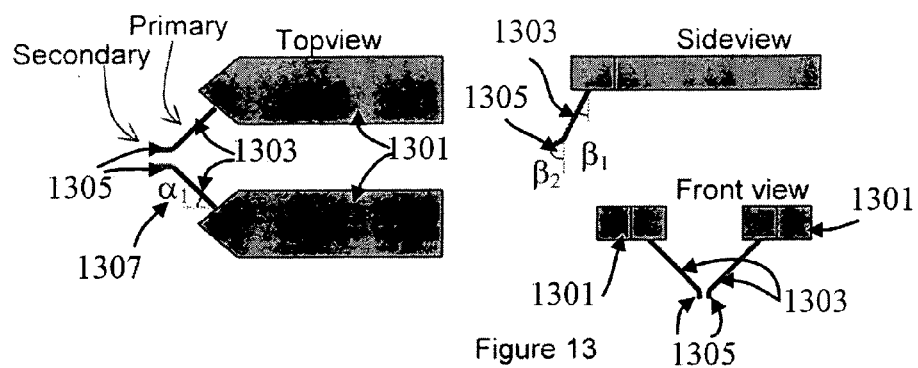
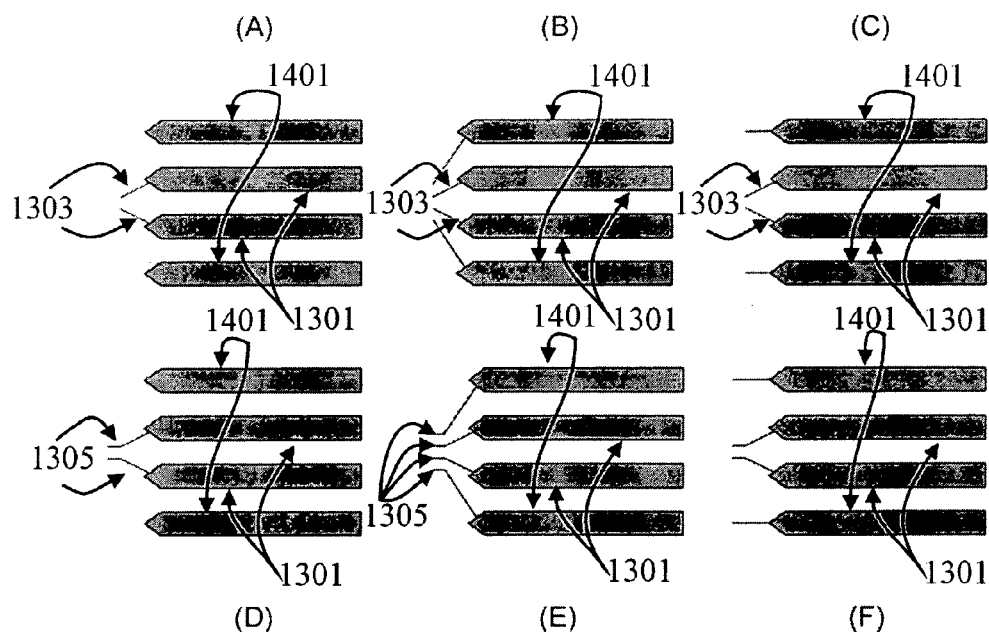
Figure 13
Figure 14

MULTI-POINT PROBE

CROSS-REFERENCE TO RELATED APPLICATION

The present application is a continuation of U.S. application Ser. No. 09/750,645 filed Dec. 28, 2000, now abandoned, which is a continuation of PCT/DK99/00391, filed Jul. 8, 1999, which is incorporated herein by reference thereto in its entirety, as though fully set forth therein.

FIELD OF THE INVENTION

The present invention generally relates to the technique of testing electric properties on a specific location of a test sample and in particular the technique of probing and analysing semiconductor integrated circuits for example of LSI and VLSI complexity.

DESCRIPTION OF THE RELATED ART

The most commonly used technique of testing the electric properties of a test sample involves the generation of resistivity or carrier concentration profiles of the surface of a processed semiconductor wafer by the utilisation of a four-point probe as described in published international patent application WO 94/11745. Furthermore, see for example S. M. Sze, Semiconductor devices—Physics and Technology, Wiley New York (1985).

As shown generally in FIG. 1, the conventional four-point probe technique typically has the points positioned in an in-line configuration. By applying a current to the two peripheral points as shown in detail in FIG. 2, a voltage can be measured between the two inner points of the four point probe. Thus the electric resistivity of the test sample can be determined through the equation $$\rho = c \cdot (V/I),$$

wherein V is voltage measured between inner points, wherein I is current applied to the peripheral points and, wherein c is a geometry factor depending on the surface contact separation d and the dimensions of the test sample. Several schemes for calculating the correction factors have been developed, see F. M. Smits, *Measurement of Sheet Resistivities with the Four-Point Probe*, Bell System Technical J. 37, 711 (1958), EP 0 299 875 B1, and J. Shi and Y. Sun, *New method for calculation of the correction factors for the measurement of sheet resistivity of a square sample with a square four-point probe*, Rev. Sci. Instrum. 68 1814 (1997).

The four-point probe generally consists of four tungsten or solid tungsten carbide tips positioned into contact with a test sample, being for example a semiconductor wafer. An external positioning system places the four-point probe into physical contact with the semiconductor wafer by moving the four-point probe in a perpendicular motion relative to the wafer surface. Pressure perpendicular to the wafer surface has to be applied to the four-point probe, in order to ensure that all four points obtain physical contact with for example an uneven wafer surface. Hence the pressure from the tips on the surface varies between the tips. The tips are separated by a distance d, shown in FIG. 1, typically in the order of 0.5 mm.

An alternative to the above described four-point probe is the SR (Spreading Resistance) probe, described in U.S. Pat. No. 5,347,226 and hereby incorporated in this description by reference. The SR probe consists of two probe tips situated on one cantilever arm. The SR probe is brought into physical contact with wafer surface by an external positioning system, while monitoring the applied pressure such as to accurately control the physical contact to the uneven surface of a semiconductor wafer. However, since the tips are situated on the same cantilever beam the pressure monitored while monitoring the maximum pressure may possibly leave one tip with an inferior physical contact.

Additionally, reference is made to U.S. Pat. No. 5,475,318, U.S. Pat. No. 5,540,958, U.S. Pat. No. 5,557,214, European patent application EP 0 466 274 and European patent application having application number EP 98610023.8, national German patent application DE 196 48 475 and national Japanese patent applications JP 07199219, JP 01147374 and JP H8-15318, which describe the general technical field relating to methods for measuring resistance and to production of measurement probes. The U.S. patents are hereby incorporated in this description by reference. Furthermore, reference is made to Soonil Hong et al's article regarding *design and fabrication of a monolithic high-density probe card for high-frequency on-wafer testing* published in IEEE 1989, pg. 289-292, $7^{th}$ issue, Changyeol Lee et al's article regarding *high-density silicon microprobe arrays for LCD pixel inspection* published in IEEE 1996, pg. 429-434, $6^{th}$ issue, T. Fujii et al's article regarding *micropattern measurement with an atomic force microscope* published in Journal of Vacuum Science & Technology B (Microelectronics Processing and Phenomena) 1991 $9^{th}$ issue, pg. 666, H. W. P. Koops et al's article regarding *Constructive three-dimensional lithography with electron beam induced deposition for quantum effect devices* published in Journal of Vacuum Science & Technology B (Microelectronics Processing and Phenomena) 1993 $11^{th}$ issue, pg. 2386, H. W. Koops et al's article regarding *conductive dots, wires, and supertips for field electron emitters produced by deposition on samples having increased temperature* published in Journal of Vacuum Science & Technology B (Microelectronics Processing and Phenomena) 1996 $14^{th}$ issue, pg. 6, and Q. Niu et al's article regarding *double tip scanning tunnelling microscope for surface analysis* published in Physics Rev. B 1995 $51^{st}$ issue pg. 5502.

Furthermore, apart from the above described limitations as to establishing contact with the surface of the test sample to be tested the prior art probes possess limitations as to miniaturisation of the testing technique as the probes hitherto known limit the maximum spacing between any two tips to a dimension in the order of 0.5 mm due to the production technique involving mechanical positioning and arresting of the individual testing pins or testing tips, in particular as far as the four-point probes are concerned, and as far as the SR-probes are concerned exhibit extreme complexity as far as the overall structure is concerned and also certain drawbacks as far as the utilisation of the SR-probe due to the overall structure of the SR-probe.

It appears that no technique is currently available for obtaining the electric properties of individual devices on semiconductor wafers, without possible destruction of device junctions. Thus, there is a need for a device, which can perform high-resolution electric property measurements on individual devices, further minimising the possibility of destruction of semiconductor wafer surfaces.

An object of the present invention is to provide a novel testing probe allowing the testing of electronic circuits of a smaller dimension as compared to the prior art testing technique and in particular of providing a testing probe allowing a spacing between testing pins less than 0.5 mm such as in the order of 100 nm e.g. 1 nm –1 μm or even smaller spacing.

A particular advantage of the present invention is related to the fact that the novel testing technique involving a novel multi-point probe allows the probe to be utilised for establishing a reliable contact between any testing pin or testing tip and a specific location of the test sample, as the testing probe according to the present invention includes individually bendable or flexible probe arms.

A particular feature of the present invention relates to the fact that the testing probe according to the present invention may be produced in a process compatible with the production of electronic circuits, allowing measurement electronics to be integrated on the testing probe, and allowing for tests to be performed on any device fabricated by any appropriate circuit technology involving planar technique, CMOS technique, thick-film technique or thin-film technique and also LSI and VLSI production techniques.

The above object, the above advantage and the above feature together with numerous other objects, advantages and features which will be evident from the below detailed description of a preferred embodiment of the present invention is according to a first aspect of the present invention obtained by a multi-point probe for testing electric properties on a specific location of a test sample, comprising:

(a) a supporting body;
(b) a first multitude of conductive probe arms positioned in co-planar relationship with surface of said supporting body, and freely extending from said supporting body, giving individually flexible motion of said first multitude of conductive probe arms; and
(c) said conducting probe arms originating from a process of producing said multi-point probe including producing said conductive probe arms on supporting wafer body in facial contact with said supporting wafer body and removal of a part of said wafer body providing said supporting body and providing said conductive probe arms freely extending from said supporting body.

According to the basic realisation of the present invention, the multi-point probe according to the first aspect of the present invention is implemented in accordance with the technique of producing electronic circuits, in particular involving planar techniques as the probe is produced from a supporting body, originating from a wafer body on which a first multitude of conductive probe arms are produced involving deposition, accomplished by any technique known in the art, such as chemical vapour deposition (CVD), plasma enhanced CVD (PECVD), electron cyclotron resonance (ECR) or sputtering, etching or any other production technique, for example high resolution lithographic methods such as electron-beam lithography, atomic force microscopy (AFM) lithography or laser lithography, whereupon a part of the original supporting body is removed through mechanical grinding or etching producing the freely extending conducting probe arms characteristic to the present invention constituting the test pins of multi-point probes according to the first aspect of the present invention.

The above part, which is removed from the original wafer body, producing the body supporting the conductive probe arms may constitute a minor part or a major part of the original wafer body and, the supporting body may according to alternative embodiments of the multi-point probe according to the present invention dimensionally constitute a minor part or a major part as compared to the freely extending part of the conductive probe arms.

The conductive probe arms characteristic to the multi-point probe according to the first aspect of the present invention according to the basic realisation of the present invention allow the contacting of the multi-point probe in an angular positioning of the conductive probe arms in relation to the surface of the test sample to be tested as distinct from the above described four-point probe, which is moved perpendicularly in relation to the surface of the test sample. The angular orientation of the conductive probe arms of the multi-point probe allows the flexible and elastically bendable conductive probe arms to contact any specific and intentional location of the test sample and establish a reliable electrical contact with the location in question.

The technique characteristic to the present invention of establishing the contact between the multi-point probe and the test locations of the test sample by utilising an angular positioning of the conductive probe arms in relation to the test sample for contacting in a bending or flexing of the conducting probe arms prevents the probe arms from mechanically destroying or deteriorating the test sample to be tested, which may be of crucial importance in specific applications such as LSI and VLSI circuitry.

As distinct from the prior art four-point probe arm, the multi-point probe according to the present invention including a first multitude of conductive probe arms may be configured in any appropriate configuration due to the utilisation of the production technique, allowing the conducting probe arms to be orientated in any mutual orientation in relation to one another and further in relation to the supporting body for complying with specific requirements such as a specific test sample to be tested. In this context, the particular feature of the present invention, namely the possibility of utilising a production technique compatible with the techniques used for producing electronic circuits, allows the multi-point probe to be readily configured in accordance with specific requirements through the utilisation of existing CAD/CAM techniques for micro-systems. However, according to the presently preferred embodiment of the multi-point probe according to the first aspect of the present invention, the first multitude of conductive probe arms are unidirectional constituting a multitude of parallel free extensions of the supporting body.

The possibility discussed above, of configuring the multi-point probe according to the first aspect of the present invention in accordance with specific requirements and, in particular, specific configurations or geometry of the electronic circuit to be tested constituting the test sample allows the conductive probe arms to be positioned on one surface of the supporting body or, alternatively, in accordance with an alternative embodiment on two opposing surfaces of the supporting body or even on non-opposing surfaces of the supporting body e.g. on neighbouring surfaces of a cubic supporting body.

The first multitude of conductive probe arms on one surface of the multi-point probe according to the first aspect of the present invention consists of a multiple of 2, ranging from at least 2 conductive probe arms to 64 conductive probe arms, having four conductive probe arms positioned on one surface as the presently preferred embodiment. Application of a test signal to the surface of the test sample between the two peripherally positioned conductive probe arms provides a resultant test signal between the two inner conductive probe arms, including information of the electric properties of the test sample.

The first multitude of conductive probe arms of the multi-point probe according to the first aspect of the present invention have a rectangular cross section, with the dimensions defined as: width being parallel to the plane of the surface of the supporting body of the multi-point probe, depth being perpendicular to the plane of the surface of the supporting body of the multi-point probe and, length being the length of the conductive probe arms extending freely from the supporting body of the multi-point probe. The dimension ratios of the first multitude of conductive probe arms comprises ratios such as: length to width within the range 500:1 to 5:1, including ratios 50:1 and 10:1, having the ratio of 10:1 as the presently preferred embodiment, width to depth ratio within the range of 20:1 to 2:1, having the ratio of 10:1 as the presently preferred embodiment. The length of the first multitude of probe arms is in the range of 20 μm to 2 mm, having a length of 200 μm as the presently preferred embodiment. The separation of distal end-points of the conductive probe arms ranges from 1 μm to 1 mm, having 20 μm, 40 μm and 60 μm as the presently preferred embodiments. However, as previously described the dimensions of the multi-point probe according to the first aspect of the present invention varies as a function of the current state of the art in production technology and are therefore not a limitation to the present invention.

The distal ends of the first multitude of conductive probe arms comprise a variety of optional shapes in continuation of the end of the length opposing the supporting body of the multi-point probe according to the first aspect of the present invention.

The continuation of the length of the freely extending conductive probe arms include shapes as pointed distal end-points, tapered distal end-points or enlarged circular, elliptic or orthogonal squared distal ends or combinations thereof. The elaboration of the distal end-points of the first multitude of the conductive probe arms allows for optimisation of measurements of electric properties of the test sample, that being resistive, capacitive or inductive electric properties of the test sample at frequencies ranging from DC to RF including frequencies in the LF range and the HF range.

The multi-point probe according to the first aspect of the present invention further comprises, in accordance with specific requirements, a second multitude of conductive electrodes situated on co-planar, elevated or undercut areas between the first multitude of conductive probe arms on the supporting body. The second multitude of conductive electrodes are suitable for active guarding of the first multitude of conductive probe arms to significantly reduce leakage resistance and, consequently, increase the measuring accuracy of the present invention.

The material of the supporting body of the multi-point probe according to the first aspect of the present invention comprises ceramic materials or semi-conducting materials such as Ge, Si or combinations thereof. Use of the semi-conducting materials Ge, Si or combinations thereof allows for the micro-fabrication technology in the manufacturing process of the multi-point probe, hence benefiting from the advantages of the micro-fabrication technology.

The conductive layer on the top surface of the first multitude of conductive probe arms and the conductive layer of the second multitude of conductive electrodes on the multi-point probe according to the first aspect of the present invention is made by conducting materials such as Au, Ag, Pt, Ni, Ta, Ti, Cr, Cu, Os, W, Mo, Ir, Pd, Cd, Re, conductive diamond, metal silicides or any combinations thereof.

Numerous other objects, advantages and features which will be evident from the below detailed description of a presently preferred embodiment of the present invention, are obtained, according to a particular aspect of the present invention, by a multi-point probe for testing electric properties on a specific location of a test sample and further comprising:

(d) a third multitude of conductive tip elements extending from said distal end of said first multitude of conductive probe arms; and (e) said conductive tip elements originating from a process of metallization of electron beam depositions on said first multitude of conductive probe arms at said distal ends thereof.

This particular aspect of the presently preferred embodiment of the present invention may provide an extremely small separation of conductive tip elements and therefor may provide a measuring tool for a wide variety of possible test samples having extremely small dimensions.

The third multitude of conductive tip elements may comprise a primary section and a secondary section, the conductive tip elements are connected to the conductive probe arms through respective primary sections thereof and the secondary sections defining free contacting ends. This may provide several optional configurations and designs of the multi-point probe.

The multi-point probe according to the particular aspect of the present invention defines a first axial direction for each of the primary sections, the first axial direction constituting an increase of the total distance between the supporting body and the free contacting ends. The axial direction of the primary section constitutes a decrease of separation between the free contacting ends of the third multitude of conductive tip elements or constitutes a decrease of separation between free contacting ends of the third multitude of conductive tip elements being adjacent. Furthermore a second axial direction is defined for each of the secondary sections, the second axial direction constituting an increase of the total distance between the supporting body and the free contacting ends. The second axial direction of the secondary section constitutes a decrease of separation between the free contacting ends of the third multitude of conductive tip elements. The secondary axial direction of the secondary section constitutes a decrease of separation between the free contacting ends of the third multitude of conductive tip elements being adjacent.

Additionally, the first axial direction of the primary sections extends in a direction parallel to the plane defined by the first surface of the supporting body or in a direction converging towards the plane defined by the second surface of the supporting body. Likewise the second axial direction of the secondary sections extend in a direction parallel to the plane defined by the first surface of the supporting body or in a direction converging towards the plane defined by the second surface of the supporting body. These design configurations provide a wide scope of possibilities for testing a wide variety of test samples.

The third multitude of conductive tip elements may be equal to the first multitude of conductive probe arms, less than the first multitude of conductive probe arms, or greater than the first multitude of conductive probe arms, the preferable application having third multitude of conductive tip elements being dividable with 2.

The third multitude of conductive tip elements have a separation of the free contacting ends of the conductive tip elements in the range of 1 nm-100 nm, preferable application having the separations of 2 nm, 5 nm, 10 nm, 20 nm, 50 nm, 100 nm.

The dimension of the conductive tip elements define an overall length as distance between the distal ends of conductive probe arms and the free contacting ends of the conductive tip elements, the overall length is in the range of 100 nm to 100 µm, the preferable application having the overall length in the ranges 500 nm to 50 µm and 1 µm to 10 µm, and define a diameter, the diameter being in the range of 10 nm to 1 µm, preferable application having the overall length in the ranges 50 nm to 500 nm.

The material utilised in producing the third multitude of conductive tip elements may mainly consist of carbon and further consist of a concentration of contaminants.

The third multitude of conductive tip elements may originate from a process of tilted electron beam deposition, a process of perpendicular electron beam deposition, or a process of a combination of tilted electron beam deposition and perpendicular electron beam deposition. The metallization of the third multitude of conductive tip elements may originate from a process of in-situ metallic deposition or a process of ex-situ metallic deposition.

The above object, the above advantage and the above feature, together with numerous other objects, advantages and features which will be evident from the below detailed description of a presently preferred embodiment of the present invention, are obtained, according to a second aspect of the present invention, by a multi-point testing apparatus for testing electric properties on a specific location of a test sample, comprising:
 (i) means for receiving and supporting said test sample;
 (ii) electric properties testing means including electric generator means for generating a test signal and electric measuring means for detecting a measuring signal;
 (iii) A multi-point probe, comprising:
   (a) a supporting body;
   (b) a first multitude of conductive probe arms positioned in co-planar relationship with surface of said supporting body, and freely extending from said supporting body, giving individually flexible motion of said first multitude of conductive probe arms; and
   (c) said conducting probe arms originating from a process of producing said multi-point probe including producing said conductive probe arms on supporting wafer body in facial contact with said supporting wafer body and removal of a part of said wafer body providing said supporting body and providing said conductive probe arms freely extending from said supporting body;
   (d) said multi-point probe communicating with said electric properties testing means; and
 (iv) reciprocating means for moving said multi-point probe relative said test sample so as to cause said conductive probe arms to be contacted with said specific location of said test sample for performing said testing of electric properties thereof.

The multi-point testing apparatus according to the second aspect of the present invention basically includes a multi-point probe according to the first aspect of the present invention, which multi-point probe, constituting a component of the multi-point testing apparatus according to second aspect of the present invention, may be implemented in accordance with any of the above features of the multi-point probe according to the first aspect of the present invention. Furthermore, the multi-point testing apparatus according to the second aspect of the present invention includes electric properties testing means for testing the test sample comprising an electric generator means providing a test signal to the surface of the test sample, that being current or voltage, pulsed signal or signals, DC or AC having sinusoidal, squared, triangled signal contents or combinations thereof, ranging from LF to RF including HF, in accordance with specific requirements such as measurements of resistance, inductance, capacitance, slew rate, unity gain bandwidth and 3dB bandwidth. The electric properties testing means further comprises an electric measuring means providing facilities for detecting a measuring signal of the above described test signal types and frequency ranges, and providing extensive electric properties testing information and including functionalities as Fast Fourier Transformation (FFT), phase lock and real time visualisation of measured test signal. The electric properties testing means features probing means for probing of the test sample, in accordance with specific requirements, so as to perform the link between the surface of the test sample and the electric properties testing means.

The multi-point testing apparatus according to the second aspect of the present invention also includes reciprocating means for holding a multi-point probe according to the first aspect of the present invention, and positioning of the multi-point probe according to the first aspect of the present invention relative to the test sample so as to cause the conductive probe arms to obtain physical contact with a specific location on the surface of the test sample for performing the testing of the electric properties, and for recording of the specific location of the multi-point probe according to the first aspect of the present invention relative to the test sample, having a resolution of 0.1 µm or even smaller in all spatial directions. An object of having full manoeuvrability in all spatial directions, that being co-planar to the surface of the test sample or perpendicular to the surface of the test sample, is to allow for multiple point measurements utilising one calibrated multi-point probe according to the first aspect of the present invention on a full surface of a test sample, hence avoiding inaccuracies due to a multiple of calibration discrepancies. The manoeuvrability includes angular movements along an axis parallel to surface of the test sample, providing an angle between the surface of the test sample and the length of the conductive probe arms on the multi-point probe according to the first aspect of the invention, thus utilising the flexibility of the conductive probe arms to insure against possible destruction or deterioration of devices on the surface of the test sample, and along an axis perpendicular to the surface of the test sample providing a 360° rotation of the multi-point probe according to the first aspect of the present invention enabling measurements on devices on the surface of the test sample having any mutual relative co-planar angular positions.

The multi-point testing apparatus according to the second aspect of the present invention further includes means for sensing physical contact between the surface of the test sample and the multiple of conductive probe arms of the multi-point probe according to the first aspect of the present invention insuring non-destructive testing of the test sample and hence avoiding the destruction of possible devices on the surface of the test sample.

The above object, the above advantage and the above feature, together with numerous other objects, advantages and features which will be evident from the below detailed description of a presently preferred embodiment of the present invention, are obtained by a third aspect of the present invention, by a method of producing a multi-point probe comprising the following steps:
 (i) producing a wafer body,
 (ii) producing a first multitude of conductive probe arms positioned in co-planar and facial relationship with said wafer body,
 (iv) removing a part of said wafer body for providing said conductive probe arms freely extending from said non-removed part of said wafer body constituting a supporting body from which said conductive probe arms extend freely, and (v) producing a third multitude of conductive tip elements extending from said distal end of said first multitude of conductive probe arms.

The method of producing the multi-point probe in accordance with a third aspect of the present invention may involve any relevant production technique allowing the production of the freely extending conductive probe arms extending freely in relation to the supporting body. Techniques of relevance and interest are based on semiconductor micro-fabrication technology, thick-film technique, thin-film technique or combinations thereof.

Producing the third multitude of conductive tip elements comprises following steps:

(a) mounting of multi-point probe having said first surface of supporting body parallel to horizontal on to holding means in a microscope chamber;

(b) selecting angles $\alpha$ and $\beta$ describing inclination of said primary section and said secondary section of said conductive tip elements;

(c) measuring of deposition rate by focusing an electron beam in one location for 5 minutes and measuring the resulting length of a first deposition;

(d) tilting and rotating said holding means to give a field of view of said first deposition from an viewing angle identical to angle of said electron beam showing accordance with said selected angles $\alpha$ and $\beta$;

(e) depositing a length on one of said distal ends of said conductive probe arms;

(f) tilting and rotating said holding means to give a field of view of position for a second deposition;

(g) depositing said length on neighbouring said distal end of said conductive probe arms;

(h) repeating steps c through g until separation of conductive probe arms is approximately 100 nm greater than the indented separation of conductive probe arms;

(i) selecting an angle $\alpha 1$ describing a inclination of said secondary section;

(j) tilting and rotating said holding means selecting $\beta=0$ and selecting an $\alpha=\alpha 1$;

(k) extending said secondary sections in continuation of said primary sections; and (l) ensuring that the depositing progresses by alternating the position of the electron beam on first and second deposition.

The method of producing the multi-point probe in accordance with a third aspect of the present invention may furthermore the technique of applying a conductive layer to the third multitude of conductive tip elements extending from the distal end of the first multitude of conductive probe arms may involve metallization of the electron beam depositions.

BRIEF DESCRIPTION OF THE DRAWINGS

Additional objects and features of the present invention will be more readily apparent from the following detailed description and appended claims with taken in conjunction with the drawing, in which:

FIG. 13, shows probe geometry having tips extending from probe arms;

FIG. 14, shows general tip configurations. (a), shows 2-tip, (b), shows 4-tip having non-uniform tip spacing, (c), shows 4-tip, (d)-(f), shows (a)-(c) having secondary tips;

DETAILED DESCRIPTION OF THE PREFERRED EMBODIMENTS

A preferred embodiment is directed toward making a multi-point probe and is described with respect to FIGS. 3-6.

Figure 1:
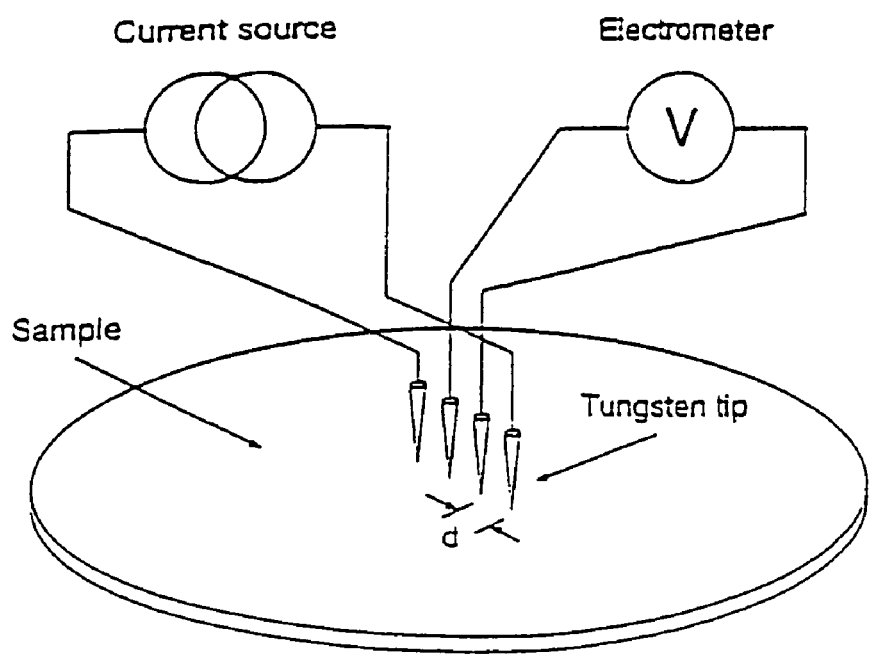
FIG. 1, provides an overall illustration of the conventional four-point probe measurement technique on a test sample.
Figure 2:
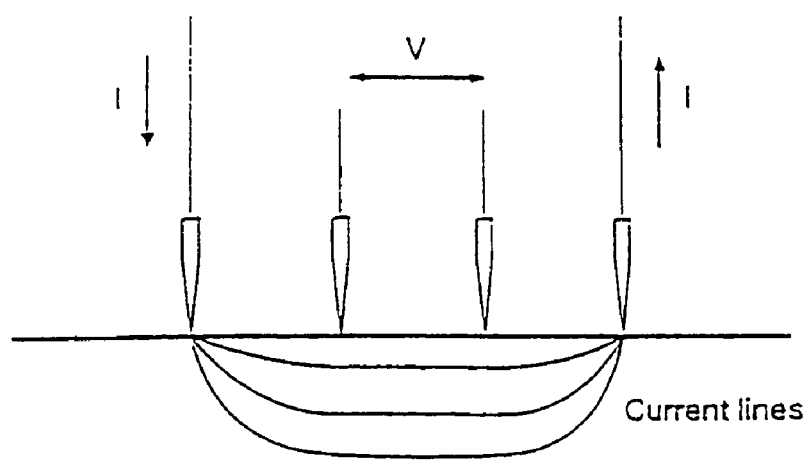
FIG. 2, shows a detailed illustration of the measurement technique depicted in FIG. 1.
Figure 3:
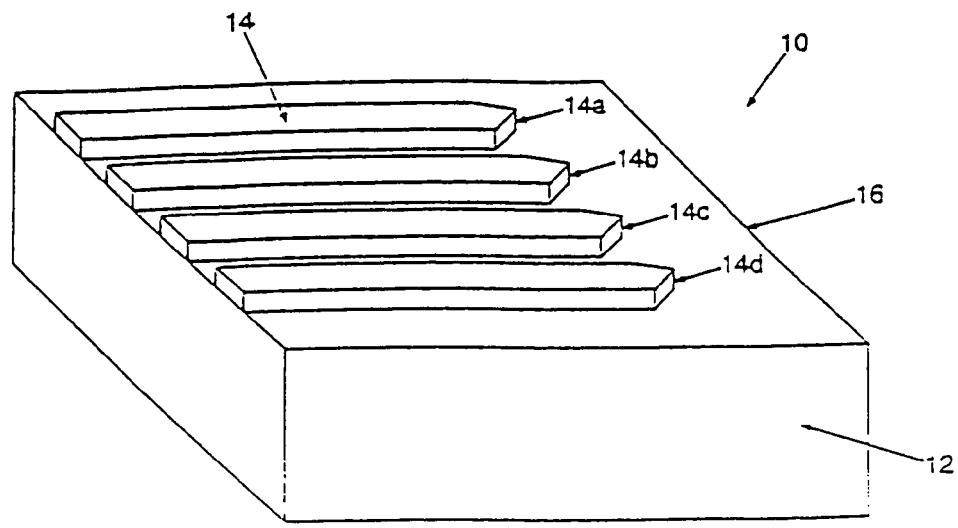
FIG. 3, depicts the substrate after patterning a deposited support layer.

FIG. 3 shows a wafer 10, for example a section of a semiconductor wafer, in intermediate state of fabrication. It shows a surface 16 of a substrate 12 covered by a support layer 14, being electrically isolating, such as silicon oxide. The deposition of the support layer 14 can be accomplished by any technique known in the art, such as chemical vapour deposition (CVD), plasma enhanced CVD (PECVD), electron cyclotron resonance (ECR) or sputtering. As shown in FIG. 3, the support layer 14 is patterned and etched to form beams with tapered end-points 14a-d. The beams are not limited to any particular form or symmetry; they can be of any geometry with suitable end-points.

The pattern is formed by forming a photoresist pattern (not shown in FIG. 3) which defines the four beams on the top surface of the support layer 14. The photoresist pattern is formed by conventional photolithographic photoresist formation, exposure, development and removal techniques. The support layer is then etched using any technique known in the art, such as dry etching or wet etching, until the unmasked parts of the support layer 14 are removed from the top surface of the substrate.

In an alternative embodiment of the present invention the four beams or part of them can be defined using high-resolution lithographic methods such as electron-beam lithography, atomic force microscopy (AFM) lithography or laser lithography.

Figure 4:
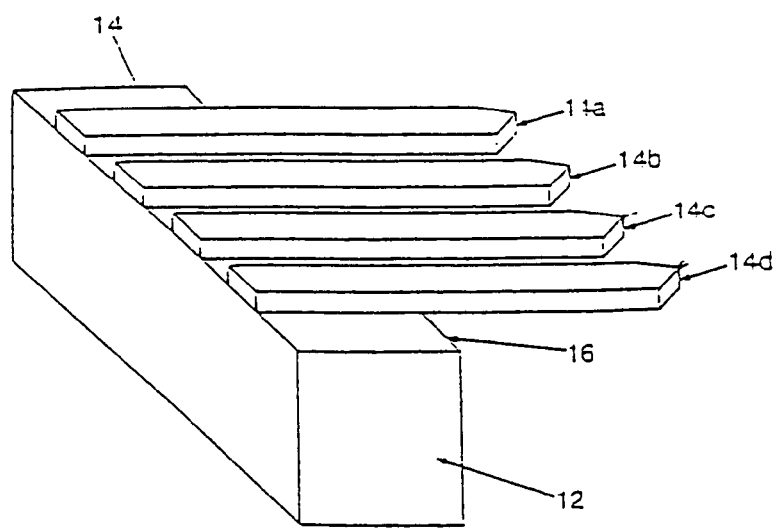
FIG. 4, illustrates the formation of the cantilevers by removal of part of the substrate.

Once the support layer has been patterned, the substrate is partially removed to release the patterned support layer, forming four cantilevers with sharpened end-points 14a-d, as illustrated in FIG. 4.

In the preferred embodiment, the substrate is removed by depositing a protective layer (not shown in FIG. 4) of silicon nitride on top and bottom surface of the substrate 12. Next, a photoresist pattern is formed on the bottom surface of the substrate by conventional photolithographic photoresist formation, exposure, development and removal techniques. The nitride layer is then removed in the unmasked areas on the bottom surface of the substrate using Reactive Ion Etch (RIE) in a plasma containing $SF_6$ and $O_2$ or similar reagents, and the substrate is etched using an etching chemistry comprising potassium hydroxide (KOH) or a similar chemistry until the freely extending probe arms are exposed. Then the protecting layer of nitride is removed from the top surface of the substrate using RIE, or using wet etching with a chemistry comprising phosphoric acid ($H_3PO_4$) or a similar chemistry.

Figure 5:
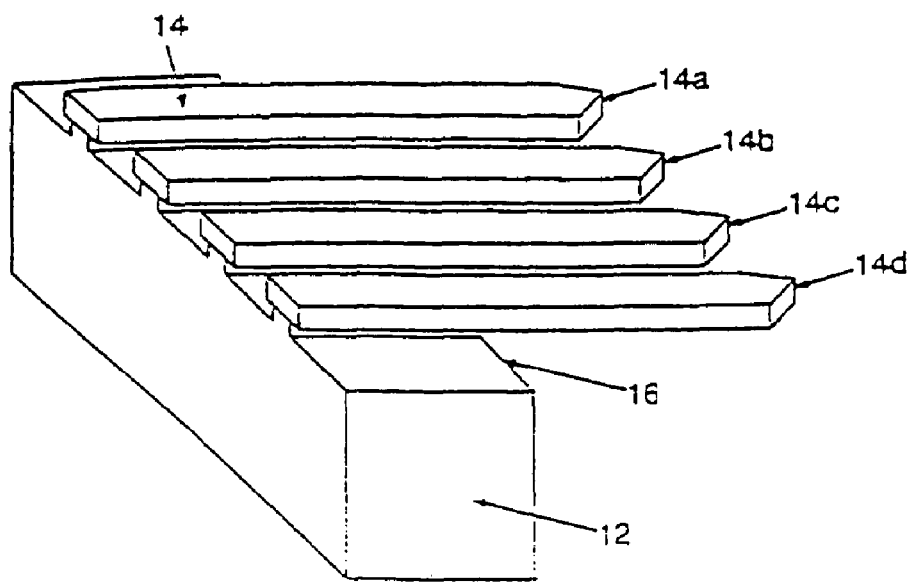
FIG. 5, depicts the etching of the substrate to undercut the pattern in the support layer.

FIG. 5, illustrates the etching of the substrate 12 to undercut the support layer 14. In the preferred embodiment, this etching step is performed with a dry etching method, such as an isotropic RIE etch.

Figure 6:
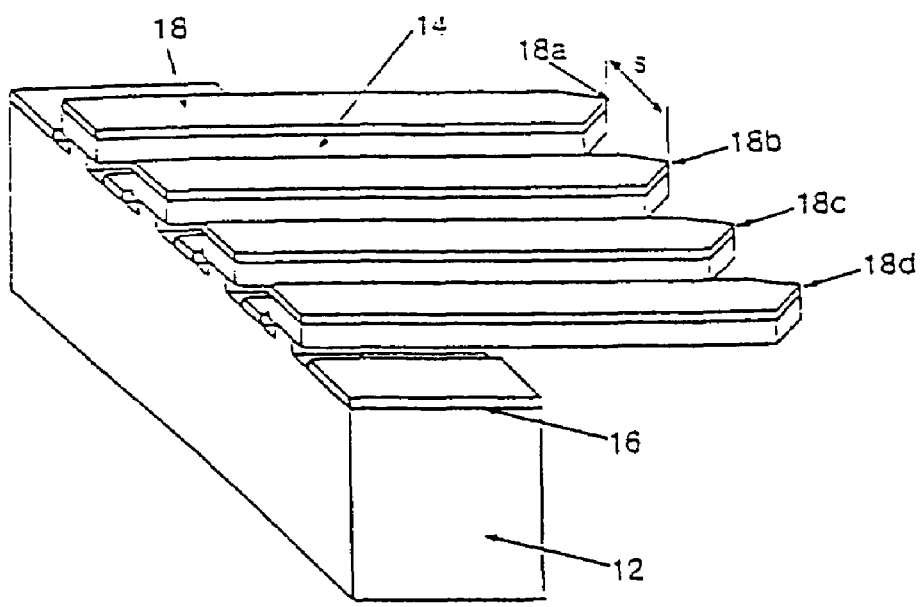
FIG. 6, depicts the deposition of an electrically conducting layer.

The final stage of fabrication is shown in FIG. 6, and involves the deposition of an electrically conducting layer 18 on the top surface of the wafer. The conducting layer is made of conducting materials like Au, Ag, Pt, Ni, Ta, Ti, Cr, Cu, Os, W, Mo, Ir, Pd, Cd, Re, conductive diamond, metal silicides or combinations thereof. Alternatively the conducting layer can be made of a highly doped semiconducting material. The conducting layer can be deposited using electron-beam evaporation, or any other similar technique known in the art. Due to the undercutting of the support layer 14, the electrically conducting layer will not create conducting paths between the four beams made in the support layer, and thus four isolated electrodes are formed on the top surface of the support beams, and thus points 18a-d can be connected through the beams to an external positioning and measuring device (not shown in FIG. 6).

As shown in FIG. 6 the deposition of the conducting layer creates electrodes on the substrate. In a preferred embodiment these electrodes are used for active guarding of the conductive probe arms to significantly reduce leakage resistance and, consequently, increase the measuring accuracy of the invention.

Referring again to FIG. 6, in the present invention the minimum probe end-point separation s is approximately 1 μm. The minimum probe end-point separation is however determined by the current state of the art in micro-fabrication technology and not any limitation of the present invention. Thus, as micro-fabrication technology produces smaller and smaller devices, the minimum probe end-point separation s can also be reduced.

In operation an external positioning device places a multi-point probe made according to the present invention into physical contact with the surface of the test sample. Once electrical contact between the surface of the test sample and all four conductive probe arms has been achieved, a current is applied to two of the conductive probe arms and a corresponding voltage is measured between the two other conductive arms. The method for applying the current and detecting the voltage can be any method known in the art.

Figure 7:
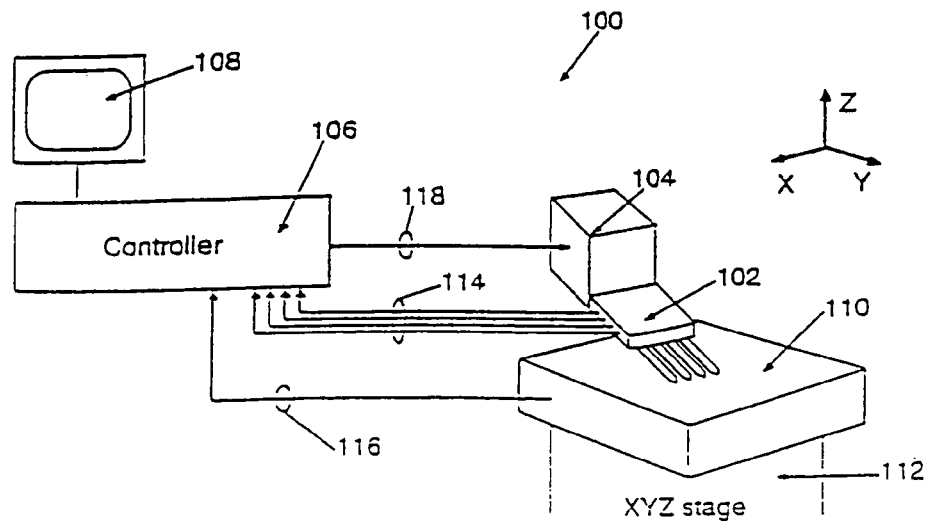
FIG. 7, depicts a set-up for measuring a test sample using a multi-point probe made in accordance with the present invention.

The preferred embodiment of the multi-point testing apparatus of the present invention is shown in FIG. 7. The figure depicts a multi-point testing apparatus 100, a test sample 110 is mounted on a stage 112 with an XYZ positioning mechanism. This mechanism can be controlled automatically or manually. A multi-point probe made according to present invention 102 is mounted above the surface of the test sample on a probe holder 104 which can be moved in the Z direction with a resolution of 0.1 μm or better. Optionally the probe holder 104 can be controlled with similar spatial resolution in the X and Y directions. The set-up 100 is similar to that of an AFM or a Scanning Tunnelling Microscope (STM). Connections 114 from the probe end-points are input to a controller 106, which can move the multi-point probe with respect to the test sample 110. Optionally a connection 116 from the test sample 110 can also be input to the controller 106. The controller 106 can be a computer or a programmed micro-controller. By monitoring the four point resistance using the end-points of the four probe arms or the two point resistances between the end-points of the four probe arms and the test sample 110, the controller 106 can move the multi-point probe towards the test sample until all end-points of the four probe arms are in physical contact with the test sample. By holding the multi-point probe having the probe arm lengths in an angle relative to the surface of the test sample 110, smaller than perpendicular and larger than parallel, full individual probe arm flexibility is achieved, providing a safe mode of operation in regards to avoiding destruction of single devices on top surface of test sample. Then a measurement can be made of the test sample resistivity, and the controller 106 analyses the measured data and displays measurement information on display 108. The controller 106 may retract the multi-point probe, move the test sample 110 in the XY plane and repeat the procedure.

Figure 8:
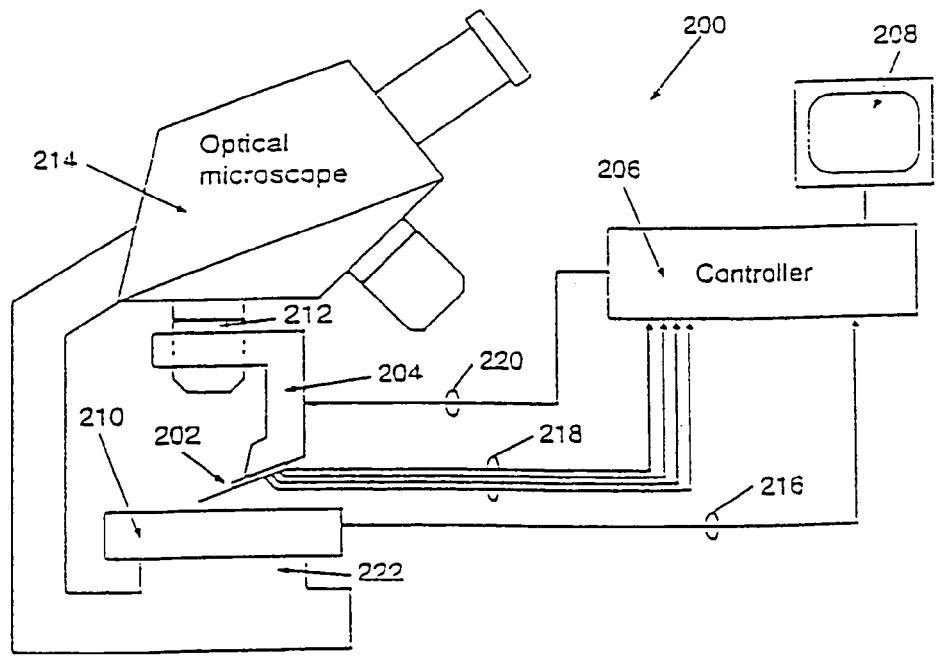
FIG. 8, illustrates a set-up having a multi-point probe made in accordance with the present invention mounted on an optical microscope.

FIG. 8 illustrates a similar apparatus 200 where the test sample stage consists of a XY positioned 222 on a standard optical microscope 214. A multi-point probe made in accordance to the present invention 202 is placed on a probe holder 204, which is mounted on a microscope objective 212, allowing the operator to identify features on the test sample surface and perform four point probe measurements at these features. In this manner μm sized test sample features such as single microelectronic devices or polycrystalline grains can be probed in a controlled fashion. Similar to the previously described apparatus 100, illustrated in FIG. 7, the four leads 218 from the probe are input to a controller 206 as well as a lead 216 connecting to the test sample; the controller outputs signals 220 controlling the movement of the probe holder, and the controller 206 analyses and presents the measurement data on display 208.

Figure 9:
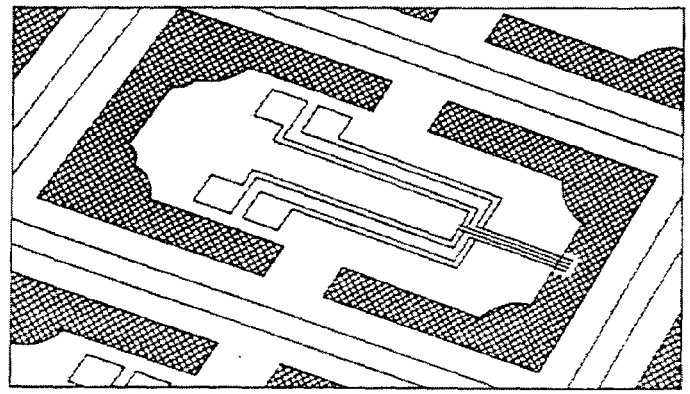
FIG. 9, pictures a detachable multi-point probe in a semi-conducting wafer.

FIG. 9, pictures a detachable multi-point probe in a semi-conducting wafer. A wafer can consist of several multi-point probes, which are detachable from the wafer.

This production technique provides an extremely repeatable and safe method of fabrication of multi-point probes.

Figure 10:
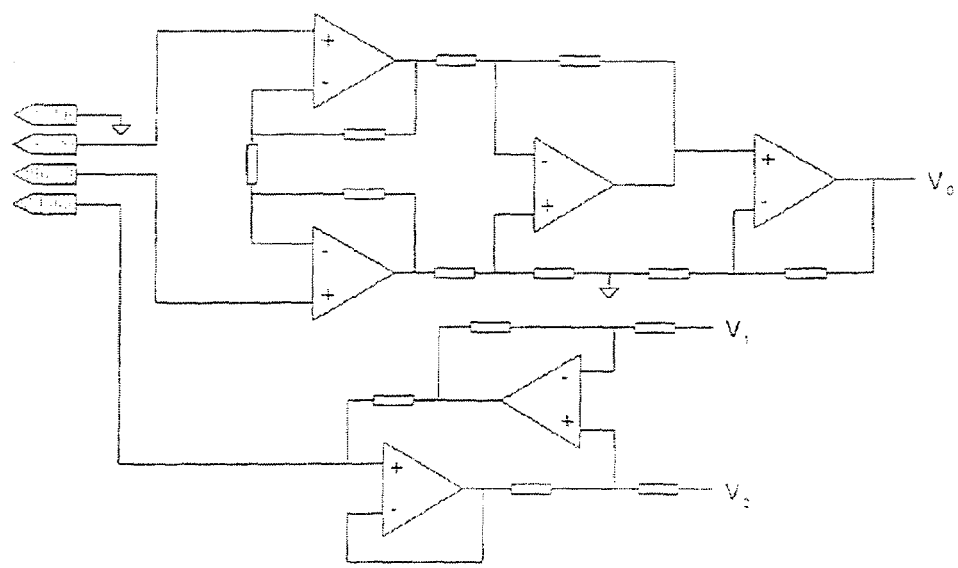
FIG. 10, shows a principal diagram of the circuit used for performing measurements, comprising an electrometer and a current source.

FIG. 10, shows a principal diagram of the circuit used for performing measurements, comprising an electrometer and a current source. Applying integrated circuit techniques for the fabrication of multi-point probes enables the possible integration of the electrometer, current source and additional circuit on the wafer.

Figure 11:
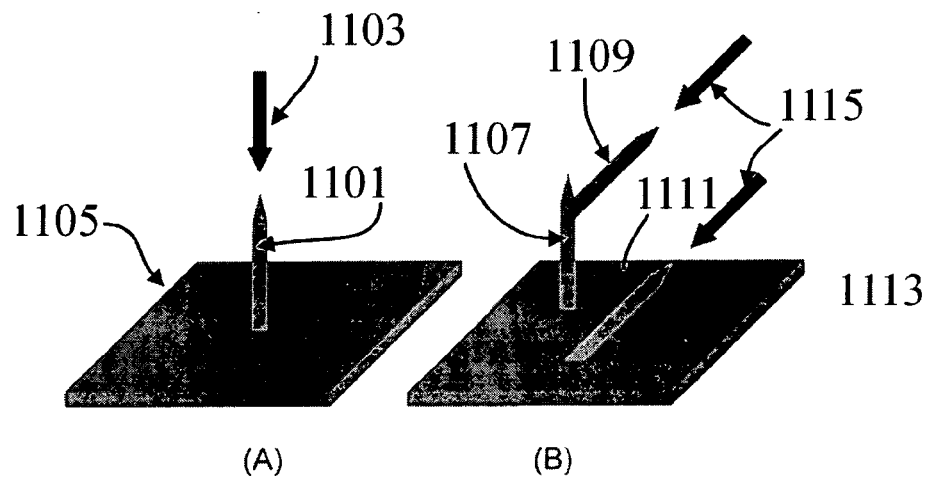
FIG. 11, shows an electron beam deposition. (a), shows a perpendicular electron beam disposition and (b), shows a tilted electron beam deposition either on the substrate or as continuation on top of an previously produced tip.

A particular preferred embodiment of the present invention utilises electron beam deposition techniques for growing tips on probe arms. FIG. 11(a), shows such an electron beam deposition grown from a surface 1105 of a probe arm having the electron beam 1103 in a perpendicular relation to the surface thus creating a primary tip 1101 having an axis perpendicular to surface plane. By tilting an electron beam 1115 in relation to a surface 1113 a tilted electron beam deposition grows either on the surface 1113 of substrate as a primary tip 1111 or as a secondary tip 1109 in continuation on top of a previously produced tip 1107 perpendicular to the surface 1113.

Figure 12:
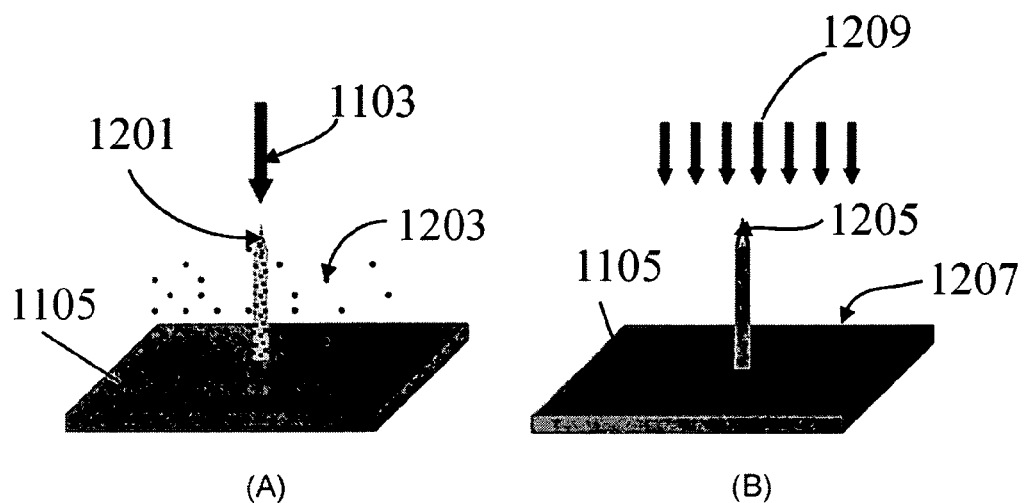
FIG. 12, shows metallization of tip. (a), shows in-situ metallization of tip applying conducting contaminants and (b), shows ex-situ metallization of tip applying subsequent metallization.

The electric properties of the tips may be modified by applying contaminants 1203 to a tip 1201 utilising an injection of metallo-organic compound at low partial pressure, hereby obtaining tips with resistances as low as 900 Ω (in-situ metallization). The electric properties of the tips may also be modified by applying a metallic cloud or evaporation 1209 creating metallic layers 1205,1207 on the tip 1201 and on the surface 1105 subsequent to finalising the tip growth (ex-situ metallization). By applying subsequent evaporations 1209 using two or more application angles a good metallic coverage of the tip 1101 and the surface 1105 are achieved, thus providing useful tips 1101. FIG. 12, shows both methods for metallization of tips.

The geometry of a probe is shown in FIG. 13 in top view, side view and front view. The probe is shown having to probe arms 1301 on to which primary tips 1303 have been grown by utilising electron beam deposition. The primary tips 1303 create an angle 1307 (α1) between direction of axial length of the probe arm 1301 and direction of axial length of primary tips 1303. Secondary tips 1305 extend from the primary tips 1303 on the probe arms 1301. The primary tips 1303 furthermore have an inclination 1309 (β1) and the secondary tip 1305 and additional inclination 1311 (β2) in relation to the direction of the axial length of the probe arm 1301.

Several tip configurations are shown in FIG. 14. FIG. 14(a) shows four parallel probe arms, two outer probe arms 1401 and the two inner probe arms 1301 having two primary tips 1303 positioned on the two inner probe arms 1301. The two primary tips 1303 create an angle in relation to axial direction of the inner probe arms 1301 such that the primary tips 1303 point a common orientation. FIG. 14 (b) shows the four parallel probe arms 1301,1401 having four primary tips 1303,1403 positioned so that the end point have equal tip separations. FIG. 14 (c) shows the four probe arms 1301, 1401 each having primary tips 1303,1403 extending from distal end. The two inner probe arms 1301 having the primary tips 1303 pointing toward a common orientation and the two outer probe arms 1401 pointing toward in axial direction of the outer probe arms 1401. FIGS. 14(d) to (f) show secondary tips 1305,1405 added to the primary tips 1303,1403.

Figure 15:
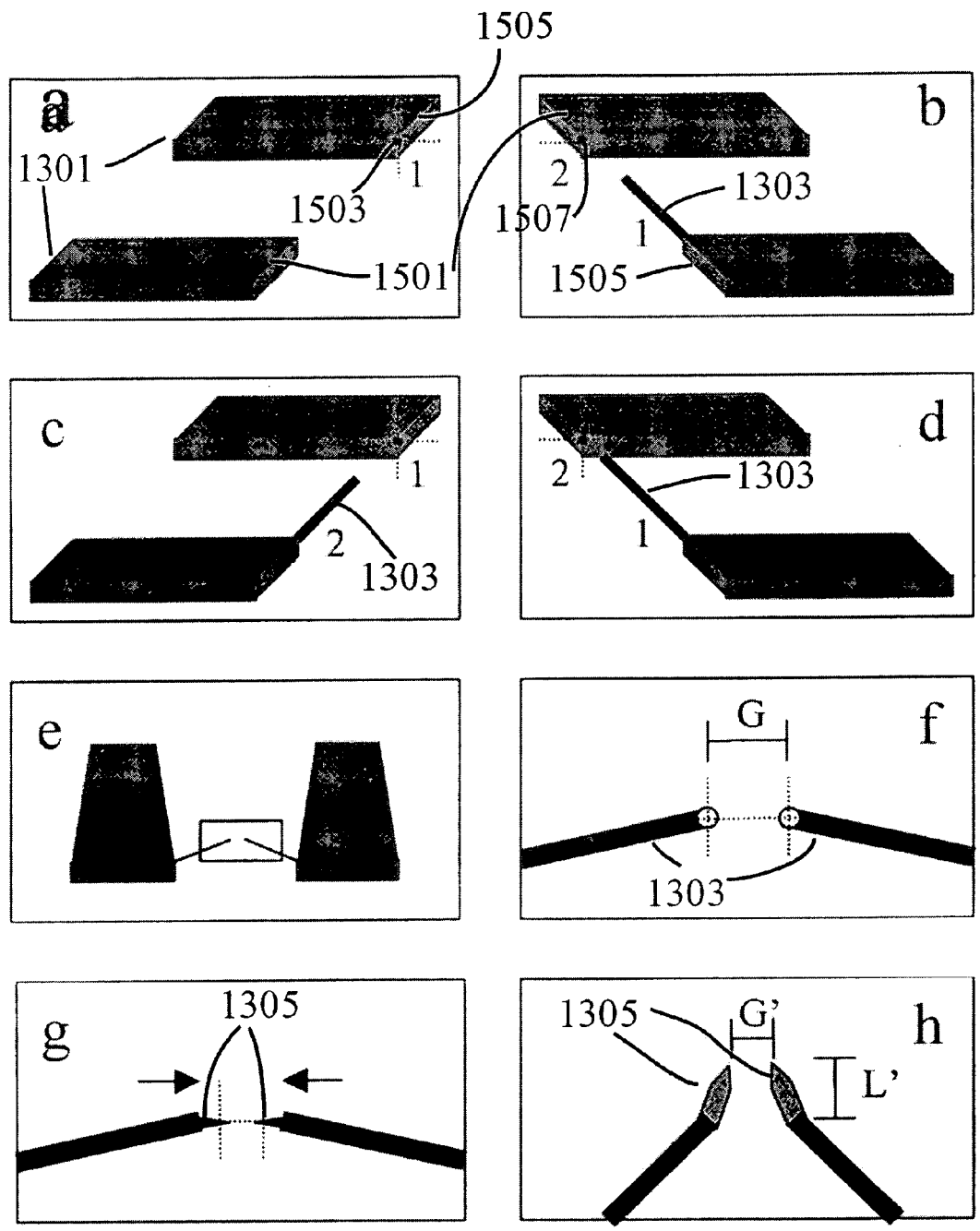
FIG. 15, shows tip fabrication of probe. (a), shows initial view. A tip is grown on probe arm 1. (b), shows the sample rotated/tilted hereby obtaining a mirrored view. A tip is grown on probe arm 2 on the pointing line of tip 1. (c)-(d), shows the result of repeating the procedure until the gap G is slightly larger than the intended gap G'. (e), shows the sample rotated to obtain a frontal view, however additionally tilted to obtain the chosen angle $\alpha'$ of the secondary tips. (f)-(g), shows the secondary tips grown on both tip ends. (h), shows the intended gap G' and the lengths tuned by repeating steps (f)-(g).

The fabrication scheme for producing primary and secondary tips applying electron beam deposition is shown in FIG. 15. FIG. 15(a) shows the two probe arms 1301 having distal ends defined as 1501 and 1505. The electron beam is aimed at a corner 1503 of the surface of the distal end 1505, hereby producing the primary tip 1303. As shown in FIG. 15(b) the electron beam is subsequently aimed at a corner 1507 of the surface of the distal end 1501, hereby producing the second primary tip 1301. This procedure is repeated until the separation between the two primary tips 1301 is slightly larger than the intended gap G' between the primary tips 1301. The primary tips 1303 create an angle in relation to axial direction of probe arms 1301 and an angle in relation to the surfaces of the distal ends 1501,1505 such that the primary tips 1303 point away from the supporting body of the multi-point probe. The secondary tips 1305 furthermore create an angle in relation to axial direction of the primary tips 1303. In order to achieve this secondary angling of the secondary tips 1305 in relation to the primary tips 1301 the multi-point probe is rotated as shown in FIG.15(e).

Figure 16:
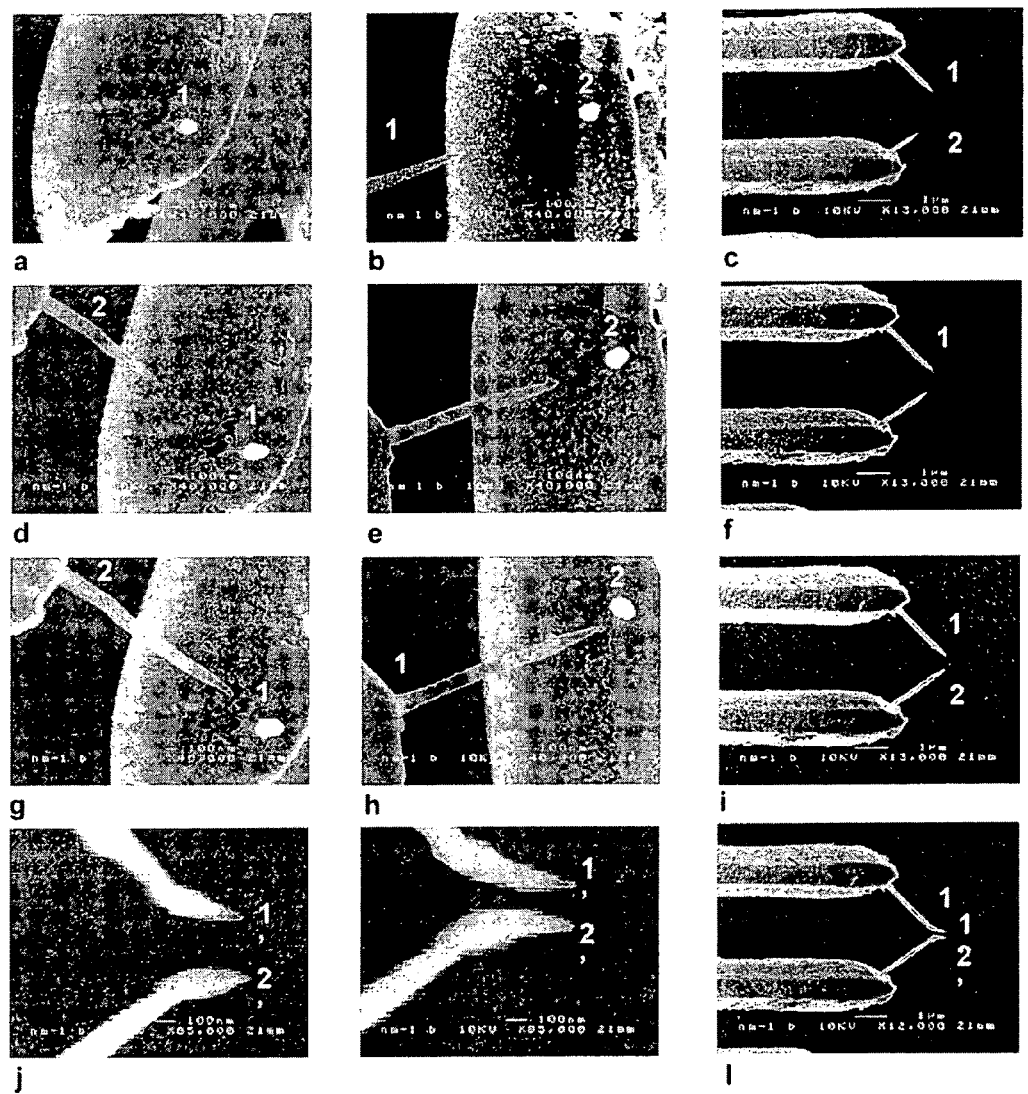
FIG. 16, shows scanning electron microscope pictures of the fabrication sequence (identical to FIG. 15). (a)-(c), shows initial growth of tip 1 and 2. (d)-(f), shows second iteration. (g)-(l), shows third iteration resulting in gap G' of 300 nm. (j), shows initial growth of secondary tips. (k), shows the secondary tips after narrowing in the gap and fine tuning the lengths to within 10 nm. (l) Overview picture of finished probes.

FIG. 16, shows electron microscope pictures of the fabrication scheme presented above and in FIG. 15.

Example Showing the Usage of the Multi-point Probe.

The probe chips (illustrated in FIG. 9) are broken out of the wafers and are mounted on ceramic dies (5 mm×10 mm) with four big thick-film electrode pads, using epoxy. The conductive probe arms on the silicon chips are connected to the pads on the ceramic dies by bonding 25 μm thick gold wires between them, using a Kulicke-Soffa wedge-bonding machine.

The ceramic chips are fixed mechanically and contacted electrically on an aluminium mount, which is machined to fit around a microscope objective on a Karl-Suss probe station. The mount allows the conductive probe arms of the multi-point probe to be in focus in the middle of the field of view of the microscope. The test sample can then be moved into focus using the normal vertical stage of the microscope. When the test sample is in focus the multi-point probe will contact the test sample and a measurement can be performed. This set-up is similar to the general illustration in FIG. 8.

Electronics consisting of an electrometer and a current source is built into the aluminium mount to minimise the distance between the probe and the electronics. This keeps the noise in the measurements at a minimum. The principal diagram of the circuit is shown in FIG. 10. The two inner conductive probe arms of the multi-point probe are connected to an electrometer (an instrumentation amplifier) with an input impedance of more than 10 GΩ and an amplification factor of 5000. The peripheral two conductive probe arms of the probe are connected to the current source (a differential voltage to current converter) which delivers an adjustable output in the range of 10 nA to 1 μA. The current output is proportional to the voltage difference V1-V2. These voltages are generated externally by a computer equipped with a digital to analogue converter. The same computer detects the output voltage Vo of the electrometer through an attached analogue to digital converter. Batteries power the circuit in order to make it float with respect to ground.

A measurement is performed by sampling the voltage of the electrometer for both polarities of the current, taking the average of the two values. This averaging procedure is useful for eliminating thermal drift in the electronics.

The invention claimed is:

1. A multi-point probe for testing electric properties on a specific location of a test sample, comprising:
   a supporting body defining a first surface;
   a first multitude of conductive probe arms, each of said conductive probe arms defining a proximal end and a distal portion and distal end being positioned in parallel relationship with said first surface of said supporting body along substantially the entire length of said conductive probe arms, and said conductive probe arms being movable in x, y, or z planes and being connected to said supporting body at said proximal ends thereof and having said distal ends freely extending and away from said supporting body, leaving said distal portions and ends free to contact a sample unsupported by said supporting body, giving individually flexible motion to said first multitude of conductive probe arms for allowing said distal end to contact said specific location of said test sample, said conductive probe arms freely extending from said supporting body in parallel relationship with said first surface of said supporting body along substantially the entire length of said conductive probe arms; and a second multitude of conductive guarding electrodes being positioned on second multitude of areas defined on said first surface between said first multitude of conductive probe arms, and comprising an insulating spacing between said electrodes and said conductive probe arms, said second multitude of conductive electrodes for active guarding and extending along side said first multitude of probe arms only up to their distal portions, so that said second electrodes are shorter than said first probe arms and said distal portions and ends of said first probe arms are free to contact the test sample.

2. The multi-point probe according to claim 1, wherein said second multitude of areas are combinations of undercut and parallel in relation to the plane of said first surface of said supporting body.

3. The multi-point probe according to claim 1, wherein said first multitude of conductive probe arms are unidirectional, constituting a first multitude of parallel free extensions of said supporting body.

4. The multi-point probe according to claim 1, wherein said supporting body further comprises a second surface parallel to said first surface, and said multi-point probe further comprises an additional multitude of conductive probe arms defining a proximal end and a distal end being positioned in parallel relationship with said second surface of said supporting body, and said additional conductive probe arms being connected to said supporting body at said proximal ends thereof and having said distal ends freely extending from said supporting body, giving individually flexible motion to said additional multitude of conductive probe arms.

5. The multi-point probe according to claim 1, wherein said first multitude of conductive probe arms are in a multiple of 2, ranging from at least 2 said conductive probe arms to 64 said conductive probe arms.

6. The multi-point probe according to claim 5, wherein said first multitude of conductive probe arms have 4 said conductive probe arms.

7. The multi-point probe according to claim 1, wherein said first multitude of conductive probe arms have a substantially rectangular cross section defining:

the dimension of width as a distance between the lines of said rectangular cross section perpendicular to the plane of said first surface of said supporting body, the dimension of depth as a distance between the lines of said rectangular cross section parallel to the plane of said first surface of said supporting body, and the dimension of length as a distance from said proximal end of said conductive probe arms to said distal end of said conductive probe arm.

8. The multi-point probe according to claim 1, wherein said first multitude of conductive probe arms have a ratio of said length to said width within the range of 500:1 to 5:1.

9. The multi-point probe according to claim 8, wherein said first multitude of conductive probe arms have a ratio of said length to said width within the range of 50:1 to 10:1.

10. The multi-point probe according to claim 9, wherein said first multitude of conductive probe arms have a ratio of said length to said width of 10:1.

11. The multi-point probe according to claim 1, wherein said first multitude of conductive probe arms have a ratio of said width to said depth within the range of 20:1 to 2:1.

12. The multi-point probe according to claim 1, wherein said first multitude of conductive probe arms have a ratio of said width to said depth of 10:1.

13. The multi-point probe according to claim 1, wherein said first multitude of conductive probe arms have tapered elements extending from said distal end of said conductive probe arms.

14. The multi-point probe according to claim 1, wherein said first multitude of conductive probe arms have pointed shaped elements extending from said distal end of said conductive probe arms.

15. The multi-point probe according to claim 1, wherein said first multitude of conductive probe arms have said lengths in the range of 20 μm to 2 mm.

16. The multi-point probe according to claim 15, wherein said first multitude of conductive probe arms have said lengths of 200 μm.

17. The multi-point probe according to claim 1, wherein said first multitude of conductive probe arms have a separation of distal ends of said conductive probe arms in the range of 1 μm to 1 mm.

18. The multi-point probe according to claim 17, wherein said first multitude of conductive probe arms have a separation of distal ends of said conductive probe arms in the range of 20 μm to 60 μm.

19. The multi-point probe according to claim 1, wherein said supporting body is of a ceramic material.

20. The probe according to claim 1 wherein said probe arms are moveable in all spatial directions.

21. A multi-point probe for testing electric properties on a specific location of a test sample, comprising:

a supporting body defining a first surface;

a first multitude of conductive probe arms, each of said conductive probe arms defining a proximal end and a distal portion and distal end being positioned in parallel relationship with said first surface of said supporting body along substantially the entire length of said conductive probe arms, and being connected to said supporting body at said proximal ends thereof and having said distal ends freely extending and away from said supporting body, leaving said distal portions and ends free to contact a sample unsupported by said supporting body, giving individually flexible motion to said first multitude of conductive probe arms for allowing said distal end to contact said specific location of said test sample; and a second multitude of conductive guarding electrodes being positioned on second multitude of areas defined on said first surface between said first multitude of conductive probe arms, and comprising an insulating spacing between said electrodes and said conductive probe arms, said second multitude of conductive electrodes for active guarding and extending along side said first multitude of probe arms only up to their distal portions, so that said second electrodes are shorter than said first electrodes and said distal portions and ends of said first probe arms are free to contact test surfaces and wherein said second multitude of areas are undercut in relation to the plane of said first surface of said supporting body.

22. The multi-point probe according to claim 21, wherein said second multitude of areas provide a supporting surface of said supporting body smaller than the surface of said conductive probe arms facing said supporting body.

23. A multi-point probe for testing electric properties on a specific location of a test sample, comprising:
a supporting body defining a first surface;
a first multitude of conductive probe arms, each of said conductive probe arms defining a proximal end and a distal end being positioned in parallel relationship with said first surface of said supporting body along substantially the entire length of said conductive probe arms, and said conductive probe arms being connected to said supporting body at said proximal ends thereof and having said distal ends freely extending from said supporting body, giving individually flexible motion to said first multitude of conductive probe arms for allowing said distal end to contact said specific location of said test sample, said conductive probe arms freely extending from said supporting body in parallel relationship with said first surface of said supporting body along substantially the entire length of said conductive probe arms; and
a second multitude of conductive guarding electrodes being positioned on second multitude of areas defined on said first surface between said first multitude of conductive probe arms, and comprising an insulating spacing between said electrodes and said conductive probe arms, said second multitude of conductive electrodes for active guarding, said first probe arms extending beyond said second guarding electrodes, so that said second guarding electrodes are shorter than said first probe arms and their distal ends are free to contact the test sample;
a first conductive layer positioned on said multitude of conductive probe arms; and
a second conductive layer acting as said electrodes on said supporting body between said first multitude of conductive probe arms.

24. The multi-point probe according to claim 23, wherein said conductive layer comprises at least one conductive material taken from the group of Au, Ag, Pt, Ni, Ta, Ti, Cr, Cu, Os, W, Mo, Ir, Pd, Cd, Re, conductive diamond and metal silicides.

25. A multi-point probe for testing electric properties on a specific location of a test sample, comprising:
a supporting body defining a first surface;
a first multitude of conductive probe arms, each of said conductive probe arms defining a proximal end and a distal end being positioned in parallel relationship with said first surface of said supporting body along substantially the entire length of said conductive probe arms, and said conductive probe arms being connected to said supporting body at said proximal ends thereof and having said distal ends freely extending from said supporting body, giving individually flexible motion to said first multitude of conductive probe arms for allowing said distal end to contact said specific location of said test sample, said conductive probe arms freely extending from said supporting body with said distal ends freely extending and away from said supporting body, leaving said distal ends free to contact a sample unsupported by said supporting body and in co-planar relationship with said first surface of said supporting body along substantially the entire length of said conductive probe arms; and
a second multitude of conductive guarding electrodes being positioned on second multitude of areas defined on said first surface between said first multitude of conductive probe arms, and comprising an insulating spacing between said electrodes and said conductive probe arms, said second multitude of conductive electrodes for active guarding,
a third multitude of conductive tip elements extending from said distal end of said first multitude of conductive probe arms
said first probe arms extending beyond said second guarding electrodes, so that said second guarding electrodes are shorter than said first probe arms and their distal ends are free to contact the test sample.

26. The multi-point probe according to claim 25, wherein each of said third multitude of conductive tip elements comprises a primary section and a secondary section, said conductive tip elements being connected to said conductive probe arms through respective primary sections thereof and said secondary sections defining free contacting ends.

27. The multi-point probe according to claim 26, wherein each of said primary sections defines a first axial direction, said first axial direction constituting an increase of separation between said supporting body and said free contacting ends.

28. The multi-point probe according to claim 27, wherein said first axial direction of said primary section constitutes a decrease of separation between said free contacting ends of said third multitude of conductive tip elements.

29. The multi-point probe according to claim 28, wherein said first axial direction of said primary section constitutes a decrease of separation between adjacent said free contacting ends of said third multitude of conductive tip elements.

30. The multi-point probe according to claim 29, wherein each of said secondary sections defines a second axial direction, said second axial direction constituting an increase of separation between said supporting body and said free contacting ends.

31. The multi-point probe according to claim 30, wherein said second axial direction of said secondary section constitutes a decrease of separation between said free contacting ends of said third multitude of conductive tip elements.

32. The multi-point probe according to claim 31, wherein said second axial direction of said secondary section constitutes a decrease of separation between adjacent said free contacting ends of said third multitude of conductive tip elements.

33. The multi-point probe according to claim 32, wherein said first axial direction of said primary sections extends parallel to the plane defined by said first surface of said supporting body.

34. The multi-point probe according to claim 33, wherein said first axial direction of said primary sections extends in a direction converging towards the plane defined by said second surface of said supporting body.

35. The multi-point probe according to claim 34, wherein said second axial direction of said secondary sections extends parallel to the plane defined by said first surface of said supporting body.

36. The multi-point probe according to claim 34, wherein said second axial direction of said secondary sections extends in a direction converging towards the plane defined by said second surface of said supporting body.

37. The multi-point probe according to claim 36, wherein the number of conductive tip elements in said third multitude is equal to the number of conductive probe arms in said first multitude.

38. The multi-point probe according to claim 36, wherein the number of conductive tip elements in said third multitude is less than the number of conductive probe arms in said first multitude.

39. The multi-point probe according to claim 36, wherein the number of conductive tip elements in said third multitude is greater than the number of conductive probe arms in said first multitude.

40. The multi-point probe according to claim 36, wherein the number of conductive tip elements in said third multitude is divisible by 2.

41. The multi-point probe according to claim 36, wherein said third multitude of conductive tip elements have a separation of said free contacting ends of said conductive tip elements in the range of 1 nm to 100 nm.

42. The multi-point probe according to claim 36, wherein said third multitude of conductive tip elements have a separation of said free contacting ends of said conductive tip elements in the range of 2 nm to 50 nm.

43. The multi-point probe according to claim 36, wherein said third multitude of conductive tip elements have a separation of said free contacting ends of said conductive tip elements in the range of 5 nm to 20 nm.

44. The multi-point probe according to claim 36, wherein each of said conductive tip elements define an overall length as distance between said distal ends of conductive probe arms and said free contacting ends of said conductive tip elements, said overall length being in the range of 100 nm to 100μm.

45. The multi-point probe according to claim 44, wherein said overall length is in the range of 500 nm to 50 μm.

46. The multi-point probe according to claim 44, wherein said overall length is in the range 1 μm to 10 μm.

47. The multi-point probe according to claim 36, wherein each of said conductive tip elements defines a diameter, said diameter being in the range of 10 nm to 1 μm.

48. The multi-point probe according to claim 47, wherein said diameter is in the range of 50 nm to 500 nm.

49. The multi-point probe according to claim 36, wherein said third multitude of conductive tip elements consist primarily of carbon.

50. The multi-point probe according to claim 49, wherein said third multitude of conductive tip elements further include a concentration of contaminants.

* * * * *